(12) United States Patent
Nojiri

(10) Patent No.: US 6,489,689 B2
(45) Date of Patent: Dec. 3, 2002

(54) SEMICONDUCTOR DEVICE

(75) Inventor: Naoki Nojiri, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/865,492

(22) Filed: May 29, 2001

(65) Prior Publication Data

US 2001/0045670 A1 Nov. 29, 2001

(30) Foreign Application Priority Data

May 29, 2000 (JP) ........................................ 2000-158331

(51) Int. Cl.[7] ............................................... H01L 23/48
(52) U.S. Cl. ........................ 257/786; 257/207; 257/211; 257/503; 257/758; 257/774
(58) Field of Search ................................. 257/369, 386, 257/503, 758, 773, 774, 776, 786, 213, 207, 211

(56) References Cited

U.S. PATENT DOCUMENTS

| | | | |
|---|---|---|---|
| 5,237,199 A | * 8/1993 | Morita | ........................ 257/503 |
| 5,365,110 A | 11/1994 | Matsuoka | |
| 5,517,055 A | * 5/1996 | Pasch | .......................... 257/532 |
| 5,594,279 A | * 1/1997 | Itou et al. | .................... 257/211 |
| 5,892,276 A | * 4/1999 | Miki et al. | ................... 257/203 |
| 5,969,420 A | * 10/1999 | Kuge et al. | .................. 257/204 |
| 6,018,183 A | * 1/2000 | Hsu | ........................... 257/355 |
| 6,236,117 B1 | * 5/2001 | Ishigaki et al. | ............. 257/903 |

FOREIGN PATENT DOCUMENTS

JP    3-149823    6/1991

\* cited by examiner

Primary Examiner—Eddie Lee
Assistant Examiner—N. Drew Richards
(74) Attorney, Agent, or Firm—McDermott, Will & Emery

(57) ABSTRACT

Two NMOS transistors and two PMOS transistors are provided on a substrate. Power supply lines VDD and VSS connected to the transistors are provided in the second wiring layer. A metal line is provided in the third wiring layer, which is the uppermost wiring layer, and the pad is connected to the metal line. Even when the width of the metal line is increased so as to increase the acceptable current capacity thereof, it is possible to keep the wiring area ratio of the first wiring layer in the I/O region at a low level. Thus, it is possible to suppress the global step between the I/O region and the central region of the chip.

12 Claims, 11 Drawing Sheets

SEMICONDUCTOR DEVICE

BACKGROUND OF THE INVENTION

The present invention relates to a semiconductor device having pads. More particularly, the present invention relates to a semiconductor device in which a global step between an I/O region along the periphery of a chip and a central region of the chip is reduced even when the width of a metal line connected to a pad is increased.

In recent years, the degree of integration of a semiconductor integrated circuit has been increasing along with the advancement of minute processing techniques. A multilayer wiring structure is typically employed in an integrated circuit that is fabricated with a 0.25 μm, or subsequent, design rule. Along with the miniaturization of devices, the thickness of each wiring film and interlayer insulating film in the multilayer wiring structure has been reduced. The reduction in the thickness of each wiring film also reduces the acceptable current density thereof.

A semiconductor integrated circuit typically includes I/O cells arranged along the periphery of the chip. An I/O cell includes a protection circuit for protecting the integrated circuit from an electrostatic discharge (ESD) and an input/output circuit. The width of each I/O cell has been reduced along with a reduction in the pad pitch due to an increase in the number of pins provided in an integrated circuit. Under such circumstances, for example, the acceptable current capacity of a metal line connected to the pad of an I/O cell, through which a large current is expected to flow, is increased by increasing the width thereof as much as possible, or providing the metal line in multiple layers, so as to increase the reliability thereof against possible wire breaking due to a current flow therethrough.

FIG. 8 illustrates a layout of a conventional semiconductor integrated circuit. More specifically, FIG. 8 illustrates an I/O cell having a three-layer wiring structure. The I/O cell includes ESD protection elements, output transistors, power supply lines and a pad. The output transistors all have the same structure, and also function as the ESD protection elements. Therefore, the term "output transistors" as used herein refers to both output transistors and ESD protection elements.

FIG. 9 is a cross-sectional view taken along line 101 of FIG. 8, and FIG. 10 is a circuit diagram illustrating the semiconductor integrated circuit of FIG. 8. A gate insulating film and an interlayer insulating film for providing an insulation between wiring layers are not shown in FIG. 8 and FIG. 9.

In FIG. 8 and FIG. 9, 102 denotes a p-type semiconductor substrate, and 103 and 104 respectively denote a p-type well and an n-type well, which are provided on the semiconductor substrate 102. Two NMOS transistors N101 are provided on the p-type well 103, and two PMOS transistors P101 are provided on the n-type well 104. The transistors N101 and P101 function as output transistors, and are separated from each other by a device separation region 105. In FIG. 8 and FIG. 9, 106 and 107 denote n-type diffusion regions, which respectively serve as the drain and the source of the NMOS transistors N101, and 108 and 109 denote p-type diffusion regions, which respectively serve as the drain and the source of the PMOS transistors P101.

Moreover, in FIG. 8 and FIG. 9, VSS denotes a power supply line at a ground potential which is provided in the second wiring layer, and VDD denotes a power supply line at a predetermined potential which is also provided in the second wiring layer. The power supply line VSS is connected to the n-type diffusion region 107, serving as the source of the NMOS transistors N101, via a via hole 110, an isolated wiring region 111 which is provided in the first wiring layer, and a via hole 112 (note that the two via holes 110 and 112 appear to be a single hole in FIG. 8 because they overlap each other in the vertical direction). The power supply line VDD is connected to the p-type diffusion region 109, serving as the source of the PMOS transistors P101, via a via hole 113, an isolated wiring region 114 which is provided in the first wiring layer, and a via hole 115 (note that the two via holes 113 and 115 appear to be a single hole in FIG. 8 because they overlap each other in the vertical direction).

Moreover, 122 denotes a pad, and 116 denotes a metal line having a large width which is provided in the first wiring layer. The metal line 116 is used to connect the output transistors N101 and P101 to the pad 122. The metal line 116 is connected to the n-type diffusion region 106, serving as the drain of the NMOS transistors N101, via a via hole 117, and to the p-type diffusion region 108, serving as the drain of the PMOS transistors P101, via a via hole 118. Furthermore, the metal line 116 is connected to the pad 122 via a via hole 119, an isolated wiring region 120 which is provided in the second wiring layer, and a via hole 121 (note that the two via holes 119 and 121 appear to be a single hole in FIG. 8 because they overlap each other in the vertical direction).

However, with the conventional I/O cell illustrated in FIG. 8 and FIG. 9, when the width of the metal line 116 is increased in order to increase the acceptable current capacity thereof, the parasitic capacitance between the metal line 116 in the first wiring layer and the power supply lines VSS and VDD in the second wiring layer may increase, thereby also increasing the delay time.

Moreover, when the width of the metal line 116 in the first wiring layer is increased in an I/O region along the periphery of the chip, the wiring area ratio of the first wiring layer in the I/O region (i.e., the ratio of the total area of wiring within a unit area, e.g., 100 μm×100 μm, with respect to the unit area) increases with respect to the wiring area ratio of the first wiring layer in the central region of the chip. The difference between the wiring area ratio of the first wiring layer in the I/O region and that in the central region of the chip may cause a physical step or unevenness (hereinafter, referred to simply as a "step") on the surface, even if the interlayer insulating film deposited on the first wiring layer is flattened through a CMP process (a chemical mechanical polishing process for increasing the flatness of a surface). The step increases as the difference in the wiring area ratio of the first wiring layer increases. Moreover, the step which is caused by the difference in the wiring area ratio of the first wiring layer and remaining after the CMP process will not be significantly reduced even after a CMP process that is performed in preparation for the formation of lines in the third wiring layer. The steps occurring in the respective wiring layers accumulate to cause a so-called "global step" on the surface of the chip. Therefore, when the metal line 116 is provided as a multilayer line by using two or more wiring layers in order to further increase the acceptable current capacity, the global step between the I/O region and the central region of the chip increases. Typically, a plurality of chips are fabricated in a regular arrangement on a single wafer, and the I/O region of one chip adjoins the I/O region of another adjacent chip on the wafer. FIG. 11 illustrates an arrangement of a plurality of chips on a wafer. In FIG. 11, 150 denotes a wafer, and a plurality of chips 151 are arranged on the wafer 150. Each chip 151 includes an I/O region 152 surrounding a central region 153 of the chip. When fabricating such chips 151 each having the central region 153 surrounded by the I/O region 152, as illustrated in FIG. 11, the I/O region 152 of one chip on the wafer 150 adjoins that of another adjacent chip. Therefore, when the wiring area ratio in the I/O region 152 is significantly larger than that in the central region 153, a large area defined by two I/O regions 152 adjoining each other will have a large wiring area ratio on the wafer 150. As a result, a sufficient flatness cannot be ensured across a large area on the chip even by the CMP process, thereby causing a substantial global step on the chip surface. Then, it is difficult to ensure a desirable exposure margin in the lithography process.

Where a so-called "POE (PAD on Element)" structure, in which the pad is located above an element such as an output transistor, is employed, a parasitic capacitance occurs between the pad and the power supply lines. Specifically, referring to FIG. 12 illustrating a cross-sectional view of an I/O cell having a POE structure, the pad 122 is located above the two power supply lines VDD and VSS, thereby causing a parasitic capacitance between the pad 122 and the power supply lines VDD and VSS, which causes an increase in the delay time.

SUMMARY OF THE INVENTION

An object of the present invention is to reduce the global step while increasing the acceptable current amount by increasing the width of the metal line connected to the pad, even when the width of the I/O cell is reduced. In addition, another object of the present invention is to suppress the parasitic capacitance occurring between the metal line connected to the pad and the power supply lines connected to the output transistors.

In order to achieved these objects, in the present invention, the metal line connected to the pad is provided in an upper wiring layer that is higher in position than a lower wiring layer in which the power supply lines connected to the output transistors are provided so that the wiring area ratio of the lower wiring layer is lower than that of the upper wiring layer, thereby effectively suppressing the occurrence of the global difference.

Specifically, a semiconductor device of the present invention includes: a plurality of wiring layers; an output transistor provided on a substrate; a power supply line provided in a predetermined one of the wiring layers for supplying a power to the output transistor; a pad for connecting an output of the output transistor to an external unit; and a metal line for connecting the output transistor to the pad, wherein: the metal line is provided in one of the wiring layers that is higher in position than another one of the wiring layers in which the power supply line is provided; and a wiring area ratio of the other wiring layer which is provided under the wiring layer in which the power supply line is provided is less than a wiring area ratio of the wiring layer in which the power supply line is provided.

In one embodiment, the plurality of wiring layers include three or more wiring layers; and the metal line for connecting the output transistor to the pad is provided in an uppermost one of the wiring layers.

In one embodiment, the output transistor includes a first-conductivity-type transistor and a second-conductivity-type transistor; the first-conductivity-type transistor includes a first-conductivity-type diffusion region which is connected to the metal line; the second-conductivity-type transistor includes a second-conductivity-type diffusion region which is connected to the metal line; and the predetermined one of the wiring layers includes a vacant region where the power supply line is not present, the vacant region existing above the first- and second-conductivity-type diffusion regions which are connected to the metal line.

In one embodiment, the first- and second-conductivity-type transistors are provided so that a longitudinal direction thereof is parallel to a width direction of the pad.

In one embodiment, the power supply line is provided so as to extend in parallel to the longitudinal direction of the first- and second-conductivity-type transistors.

In one embodiment, a via hole of a stacked via structure is provided so as to extend from each of the first- and second-conductivity-type diffusion regions to the vacant region in the predetermined one of the wiring layers, the via hole extending between the predetermined one of the wiring layers in which the power supply line is provided and the first- and second-conductivity-type diffusion regions of the first- and second-conductivity-type transistors which are connected to the metal line.

In one embodiment, a part of the metal line provided in the uppermost one of the wiring layers is used as the pad.

In one embodiment, the pad is located above the output transistor.

In one embodiment, the metal line is provided in two or more of the wiring layers that adjoin one another in a vertical direction.

As described above, in the present invention, the wide metal line having a large acceptable current capacity which is connected to the pad is provided in an upper wiring layer that is higher in position than a lower wiring layer in which the power supply lines are provided. Therefore, as compared to the case where the metal line is provided in a wiring layer that is lower in position than the wiring layer in which the power supply lines are provided, the wiring area ratio of the lower wiring layer is reduced. Therefore, the difference between the wiring area ratio of the lower wiring layer in the I/O region including the pad and that in the central region of the chip is suppressed, thereby suppressing the occurrence of the global step.

Moreover, in the present invention, the metal line connected to the pad may be provided in the uppermost wiring layer. Typically, the thickness of an insulating film provided between adjacent wiring layers is greater than another insulating film that is lower in position than the insulating film. Therefore, when the metal line is provided in an upper wiring layer, particularly the uppermost wiring layer, the spacing between the metal line and the power supply lines is increased, thereby suppressing the parasitic capacitance occurring between the metal line and the power supply lines.

Moreover, in the present invention, a predetermined wiring layer in which the power supply lines are provided includes a vacant region, where no power supply line is present. Therefore, an output transistor can be connected to the metal line, which is connected to the pad, via a straight vertical path extending through the vacant region, thereby simplifying the structure of the connecting path.

In addition, in the present invention, a so-called "stacked via" structure, including a plurality of via holes that are stacked on one another and substantially aligned with one another in the vertical direction, is employed for connecting the output transistor to the metal line, which is connected to the pad. A line in the stacked via structure can be provided so as to extend only around the via holes without having to take into consideration the acceptable current capacity thereof. Therefore, the wiring area ratio of the lower wiring layer is reduced, thereby further suppressing the global step between the I/O region and the central region of the chip.

Moreover, in the present invention, a part of the metal line in the uppermost wiring layer may be used as the pad. Therefore, it is possible to suppress the parasitic capacitance occurring between the metal line and the pad while eliminating the need for a line for connecting the metal line to the pad.

Furthermore, in the present invention, when the POE structure in which the pad is located above the output transistors is employed, any part of the metal line may be used as the pad, thereby increasing the freedom in the location of the pad.

In addition, in the present invention, the metal line connected to the pad may be provided across a large area in the form of a multilayer line. Therefore, when employing an area pad structure in which the pad is located in the central region of the chip, the connection to the pad can be made only by extending an end portion of the metal line facing the central region of the chip toward the area pad, whereby it is possible to reduce the length of the extension of the metal line to the area pad.

DETAILED DESCRIPTION OF THE INVENTION

Semiconductor devices of preferred embodiments of the present invention will now be described with reference to the accompanying drawings.

First Embodiment

Figure 1:
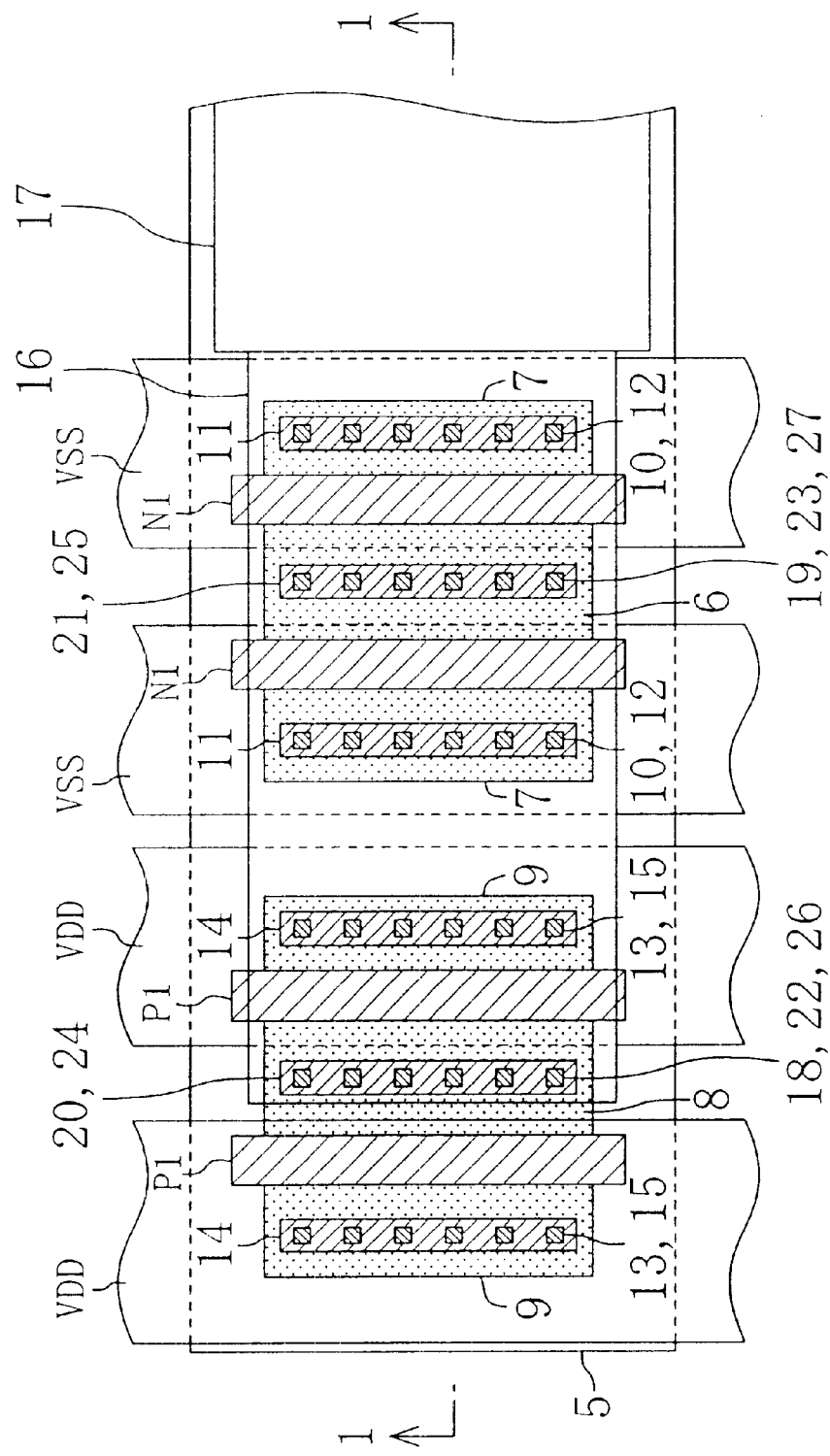
FIG. 1 is a plan view illustrating a wiring structure of a semiconductor device according to the first embodiment of the present invention.
Figure 11:
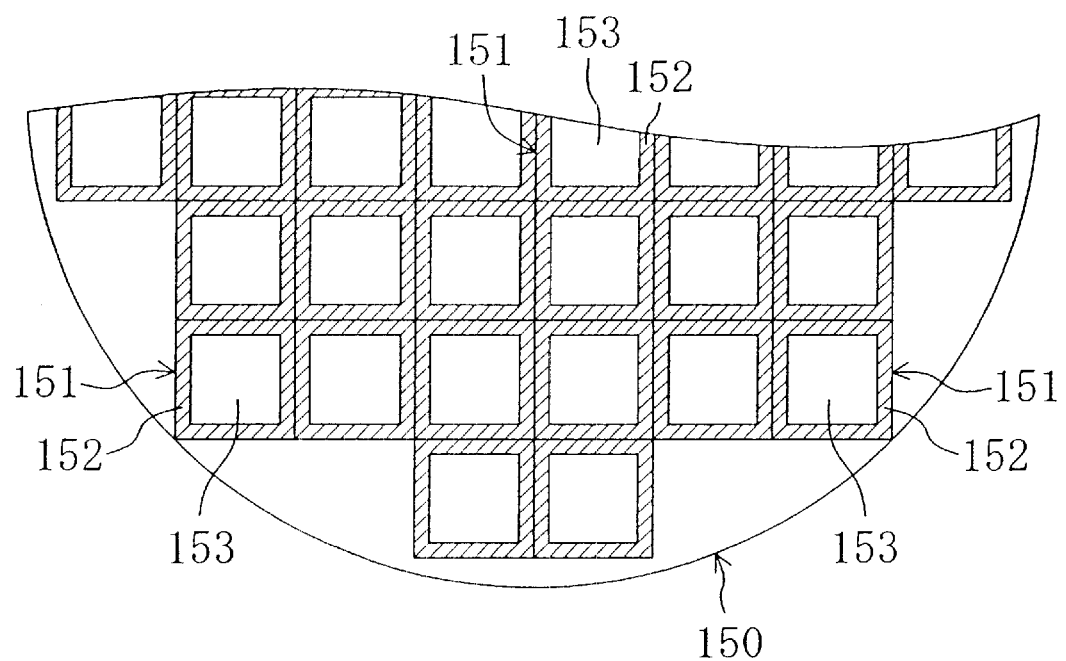
FIG. 11 is a plan view illustrating a part of a wafer on which a plurality of chips are arranged.

FIG. 1 illustrates a specific structure of a semiconductor device according to the first embodiment of the present invention. Specifically, FIG. 1 illustrates an I/O cell including ESD protection elements, output transistors, power supply lines, a pad, and lines for connecting these elements. More specifically, FIG. 1 illustrates a part of the semiconductor device corresponding to the I/O region 152 of FIG. 11. The output transistors all have the same structure, and also function as the ESD protection elements. Therefore, the term "output transistors" as used herein refers to both output transistors and ESD protection elements.

Figure 2:
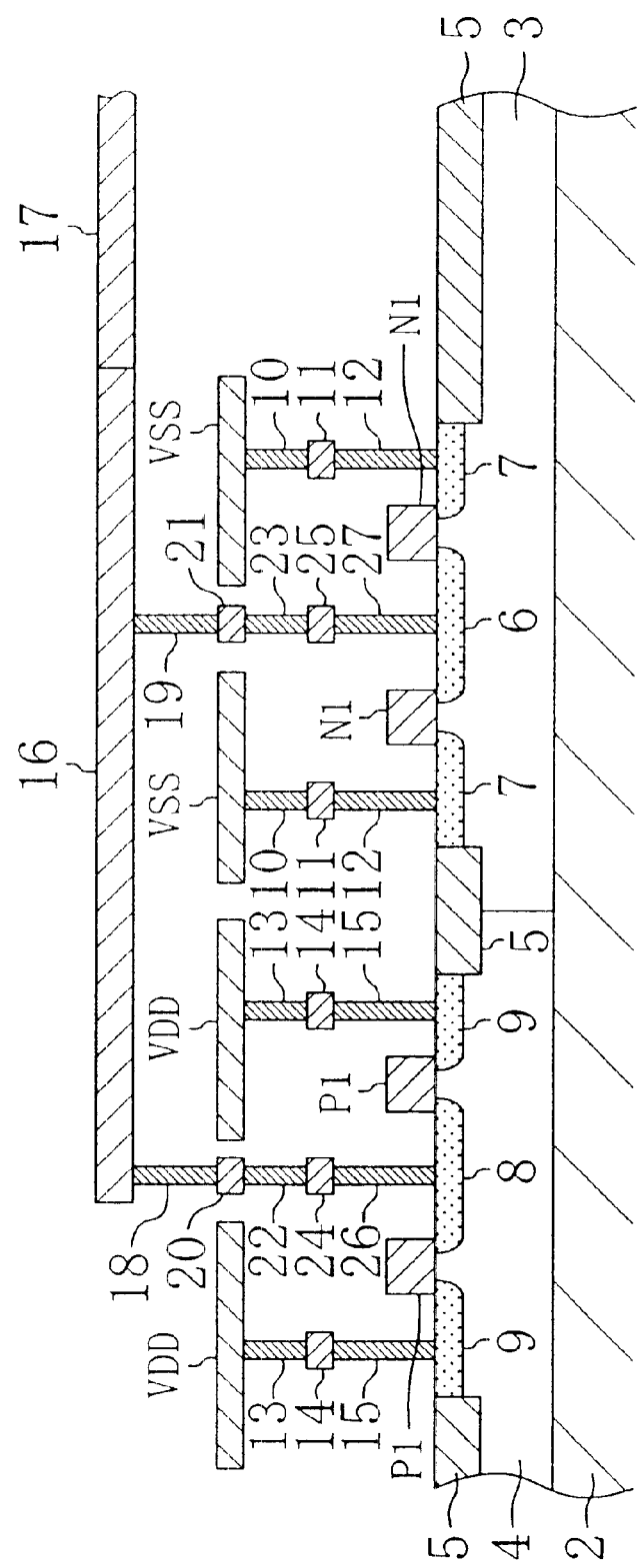
FIG. 2 is a cross-sectional view illustrating the wiring structure of the semiconductor device of the first embodiment.
Figure 3:
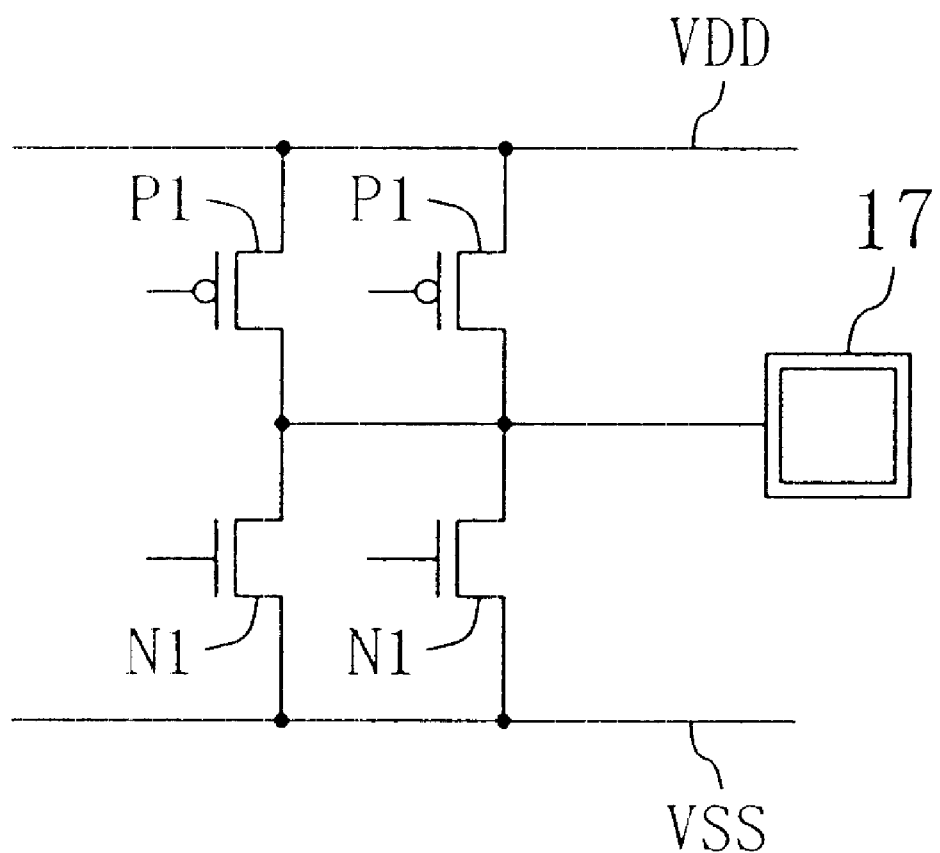
FIG. 3 is a circuit diagram illustrating the semiconductor device of the first embodiment.

FIG. 2 is a cross-sectional view taken along line 1—1 of FIG. 1, and FIG. 3 is a circuit diagram illustrating the semiconductor device of FIG. 1. A gate insulating film and an interlayer insulating film for providing an insulation between wiring layers are not shown in FIG. 1 and FIG. 2.

Referring to FIG. 1, FIG. 2 and FIG. 3, 2 denotes a p-type semiconductor substrate, and 3 and 4 respectively denote a p-type well and an n-type well, which are provided on the semiconductor substrate 2. Two NMOS transistors N1 (first-conductivity-type transistors) are provided on the p-type well 3, and are arranged with respect to each other in the horizontal direction in FIG. 2. Two PMOS transistors P1 (second-conductivity-type transistors) are provided on the n-type well 4, and are arranged with respect to each other in the horizontal direction in FIG. 2. The two NMOS transistors N1 and the two PMOS transistors P1 function as output transistors, and are separated from each other by a device separation region 5. In FIG. 1 and FIG. 2, 6 and 7 denote n-type diffusion regions (first-conductivity-type diffusion regions), which respectively serve as the drain and the source of the NMOS transistors N1, and 8 and 9 denote p-type diffusion regions (second-conductivity-type diffusion regions), which respectively serve as the drain and the source of the PMOS transistors P1.

Moreover, in FIG. 1 and FIG. 2, VSS denotes a power supply line at a ground potential which is provided in the second wiring layer (a predetermined wiring layer), and VDD denotes a power supply line at a predetermined potential which is also provided in the second wiring layer. While the power supply line VSS extends above the two NMOS transistors N1, the power supply line VSS is not present above the common drain 6 of the NMOS transistors N1. Thus, the region above the common drain 6 is a vacant region. Similarly, while the power supply line VDD extends above the two PMOS transistors P1, the power supply line VDD is not present above the common drain 8 of the PMOS transistors P1. Thus, the region above the common drain 8 is a vacant region. The power supply lines VSS and VDD extend in the longitudinal direction of the MOS transistors N1 and P1 (the vertical direction in FIG. 1), i.e., in parallel to the MOS transistors N1 and P1.

Moreover, the power supply line VSS at the ground potential is connected to the n-type diffusion region 7, serving as the source of the NMOS transistors N1, via a via hole 10, an isolated wiring region 11 which is provided in the first wiring layer, and a via hole 12 (note that the two via holes 10 and 12 appear to be a single hole in FIG. 1 because they overlap each other in the vertical direction). Similarly, the power supply line VDD is connected to the p-type diffusion region 9, serving as the source of the PMOS transistors P1, via a via hole 13, an isolated wiring region 14 which is provided in the first wiring layer, and a via hole 15 (note that the two via holes 13 and 15 appear to be a single hole in FIG. 1 because they overlap each other in the vertical direction).

In addition, a pad 17 is provided in the third wiring layer (the uppermost wiring layer), and located in the peripheral portion of the chip. In FIG. 1 and FIG. 2, the pad 17 is located on the right of the right-side n-type diffusion region 7, serving as the source of the right-side NMOS transistor N1. The two NMOS transistors N1 and the two PMOS transistors P1 extend in the width direction of the pad 17 (the vertical direction in FIG. 1), i.e., with the longitudinal direction thereof (the vertical direction in FIG. 1) being parallel to the width direction of the pad 17.

Moreover, a metal line 16 is provided in the uppermost wiring layer (the third wiring layer) in which the pad 17 is also provided, and connected to the pad 17 at a position close to the right end of the structure shown in FIG. 1 and FIG. 2. The metal line 16 has a large width that is close to the width of the pad 17 so that the metal line 16 will not be broken by a current flow therethrough. The metal line 16 is connected to the p-type diffusion region 8, serving as the drain of the PMOS transistors P1, via the vacant region above the drain of the PMOS transistors P1, more specifically via a stacked via structure including a via hole 18, an isolated wiring region 20 in the second wiring layer, a via hole 22, an isolated wiring region 24 in the first wiring layer, and a via hole 26, which are provided in the vacant region. Moreover, the metal line 16 is connected to the n-type diffusion region 6, serving as the drain of the NMOS transistors N1, via the vacant region above the drain of the NMOS transistors N1, more specifically via a stacked via structure including a via hole 19, an isolated wiring region 21 in the second wiring layer, a via hole 23, an isolated wiring region 25 in the first wiring layer, and a via hole 27, which are provided in the vacant region. Note that each of a set of the three via holes 18, 22 and 26, and another set of the three via holes 19, 23 and 27, appears to be a single hole in FIG. 1 because they overlap one another in the vertical direction.

In the semiconductor device of the present embodiment having such a structure, the power supply lines VDD and VSS are provided in the second wiring layer, and the metal line 16 connected to the pad 17 is provided in the third wiring layer overlying the second wiring layer. Therefore, when the width of the metal line 16 is increased in expectation of a large current flow through the pad 17, for example, the wiring area ratio of the third wiring layer in the I/O region increases with respect to that in the central region of the chip. However, the wiring area ratio of the first wiring layer in the I/O region is reduced, as compared to the conventional example illustrated in FIG. 9 where the wide metal line 116 connected to the pad 122 is provided in the first wiring layer. As a result, the difference between the wiring area ratio of the first wiring layer in the I/O region and that in the central region of the chip is suppressed, whereby it is possible to ensure a desirable flatness of the surface of the first wiring layer through a CMP process, thus reducing the global step between the I/O region and the central region of the chip. Accordingly, it is possible to ensure a desirable exposure margin in the subsequent lithography process for forming lines in an upper wiring layer. Moreover, after the formation of lines in the uppermost layer, even if a large global step occurs, there is no processing left to be performed that is so minute that it is difficult to ensure a sufficient focus margin of a lithography process. Therefore, the metal line 16 can be designed with a large width without having to be sensitive about the occurrence of a global step. Where the width of the I/O cell is so small that the width of the metal line 16 cannot be increased to an extent such that the metal line 16 will not be broken by a large current flow therethrough, the metal line 16 can be provided as a multilayer line of two or more metal layers because the metal line 16 is in the uppermost wiring layer, and thus the focus margin of a lithography process is sufficiently large. Since the minimum processing dimension of a lithography process for forming lines in an upper wiring layer is typically greater, and the focus margin is also larger, as compared to those of a lithography process for forming lines in a lower wiring layer, a wide metal line can suitably be provided in the uppermost wiring layer.

Moreover, the isolated wiring regions 11, 14, 24 and 25 in the first wiring layer are connected to the metal line 16 and/or the MOS transistors N1 and P1 via the via holes in the stacked via structures. Therefore, it is not necessary to take into consideration the possible wire breaking due to a current flow in the plane of the wiring layer. Accordingly, the isolated wiring regions 11, 14, 24 and 25 may be provided so as to extend only around the via holes 10, 12, 13, 15, 18, 19, 22, 23, 26 and 27 for connecting the wiring layers to one another. As a result, it is possible to reduce the wiring area ratio of the first wiring layer in the I/O region. Therefore, it is possible to further reduce, or eliminate, the global step between the I/O region and the central region of the chip, whereby it is possible to ensure a very desirable exposure margin in the lithography process for forming lines in an upper wiring layer.

Figure 9:
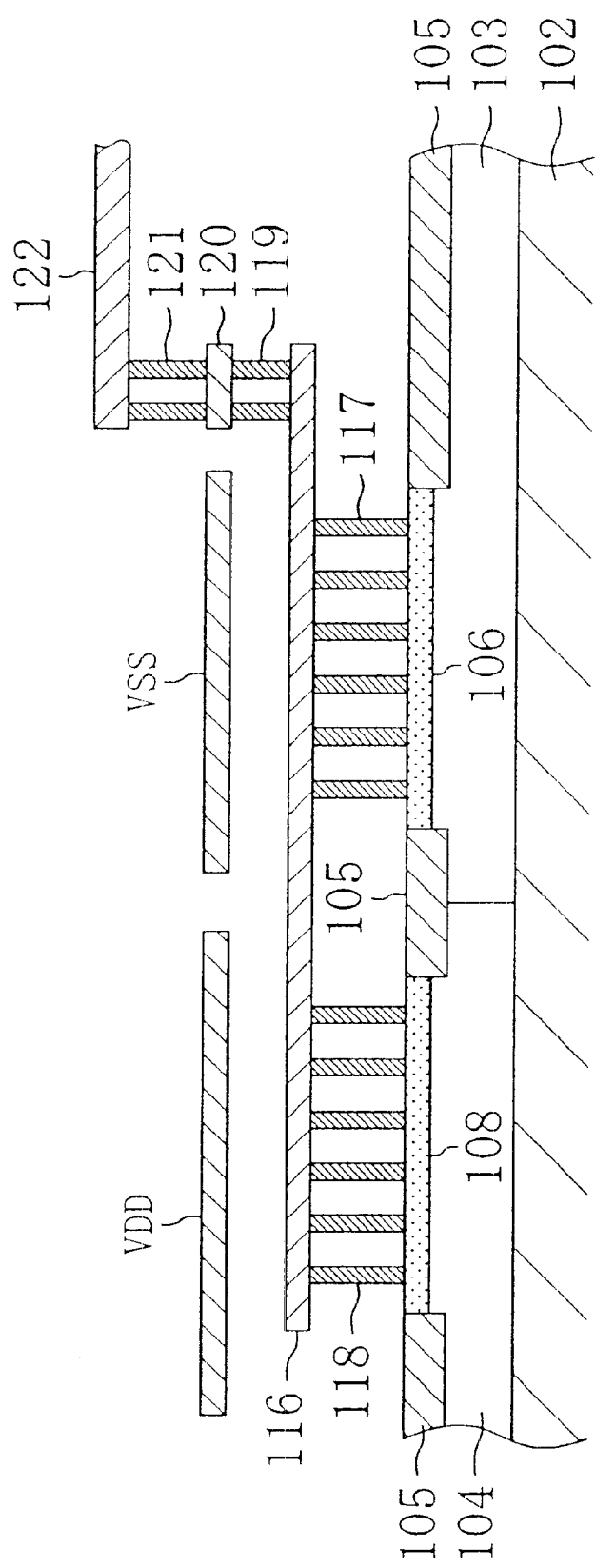
FIG. 9 is a cross-sectional view illustrating the wiring structure of the conventional semiconductor device.
Figure 10:
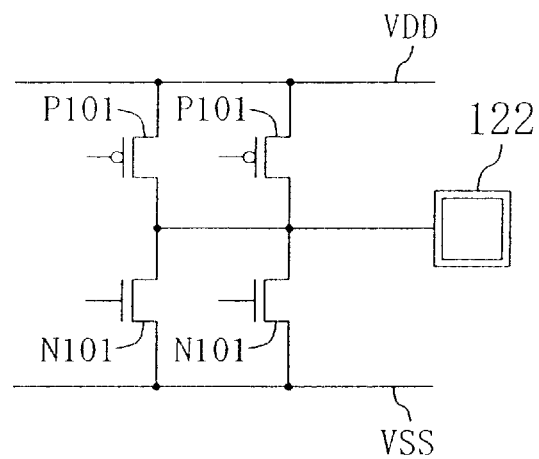
FIG. 10 is a circuit diagram illustrating the conventional semiconductor device.

Moreover, in the semiconductor device of the present embodiment, the metal line 16 connected to the pad 17 is provided in the third wiring layer (the uppermost wiring layer), and the power supply lines VDD and VSS are provided in the second wiring layer. The conventional semiconductor device illustrated in FIG. 9 is similar to the semiconductor device of the present embodiment in that the power supply lines VDD and VSS are provided in the second wiring layer, but the metal line 116 connected to the pad 122 is provided in the first wiring layer. Typically, the thickness of an insulating film provided between adjacent wiring layers is greater than another insulating film that is lower in position than the insulating film. Therefore, in the semiconductor device of the present embodiment, the spacing between the metal line 16 in the third wiring layer and the power supply lines VSS and VDD in the second wiring layer is increased as compared to that in the conventional semiconductor device, whereby the parasitic capacitance between the metal line 16 and the power supply lines VSS and VDD can be suppressed to be smaller than that in the conventional semiconductor device.

In addition, the MOS transistors N1 and P1 are provided so as to extend in the width direction of the pad 17 (the vertical direction in FIG. 1), and the power supply lines VDD and VSS are arranged in parallel to the MOS transistors N1 and P1. As a result, the power supply lines VDD and VSS do not have to be provided in a region above the n-type diffusion region 6 and the p-type diffusion region 8, serving as the drain of the MOS transistors N1 and P1, respectively. Thus, a vacant region is formed directly above each of the diffusion regions 6 and 8. The via holes 22 and 23, etc., having a stacked via structure are formed in the respective vacant regions, so that the drain of each of the MOS transistors N1 and P1 is connected to the metal line 16 in the third wiring layer via the stacked via structure formed directly above the MOS transistor. On the other hand, in a case where the region above each of the MOS transistors N1 and P1 is covered by the power supply lines VDD and VSS, for example, a line for bypassing the power supply lines VDD and VSS needs to be provided in the first wiring layer in order to connect the drain to the metal line 16 in the third wiring layer. As compared to this, with the semiconductor device of the present embodiment, it is possible to effectively suppress the wiring area ratio of the first wiring layer.

Second Embodiment

A semiconductor device according to the second embodiment of the present invention will now be described with reference to FIG. 4 and FIG. 5.

Figure 4:
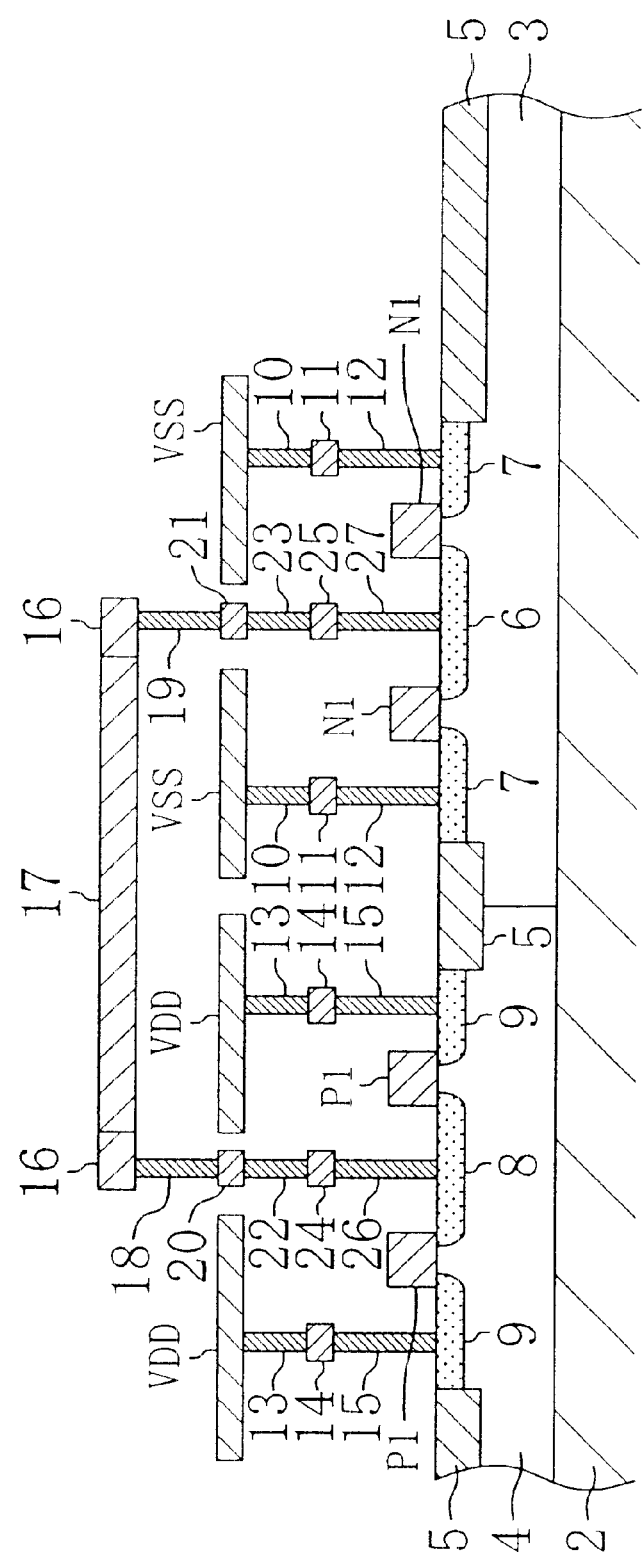
FIG. 4 is a cross-sectional view illustrating a semiconductor device according to the second embodiment of the present invention.
Figure 5:
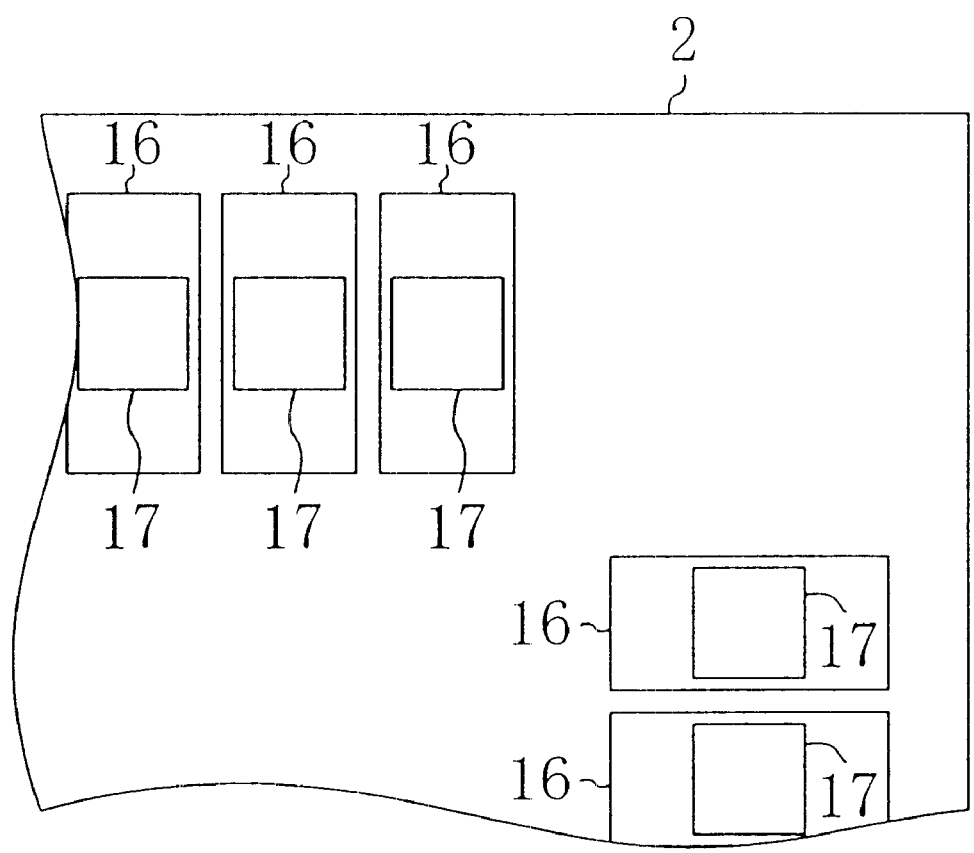
FIG. 5 is a plan view illustrating an arrangement of a plurality of semiconductor devices of the second embodiment.

FIG. 4 and FIG. 5 illustrate a specific structure of the semiconductor device of the present embodiment, wherein FIG. 4 is a cross-sectional view, and FIG. 5 is a plan view illustrating an arrangement of a plurality of semiconductor devices of the present embodiment. The semiconductor device illustrated in FIG. 4 and FIG. 5 includes three wiring layers, as in the first embodiment. Specifically, FIG. 4 and FIG. 5 illustrate an I/O cell having a POE structure in which the center of the pad 17 is located between the NMOS transistors N1 and the PMOS transistors P1.

A part of the metal line 16 in the third wiring layer is used as the pad 17. FIG. 5 illustrates the pad 17 being located in the central portion of the metal line 16. The freedom in the location of the pad 17 is high, and the pad 17 may be located at any position on the metal line 16.

In the semiconductor device of the present embodiment having the POE structure as described above, a part of the metal line 16 is used as the pad 17. Therefore, it is not necessary to provide an additional line for connecting the metal line 16 to the pad 17, and there is little parasitic capacitance therebetween.

Third Embodiment

A semiconductor device according to the third embodiment of the present invention will now be described with reference to FIG. 6 and FIG. 7.

Figure 6:
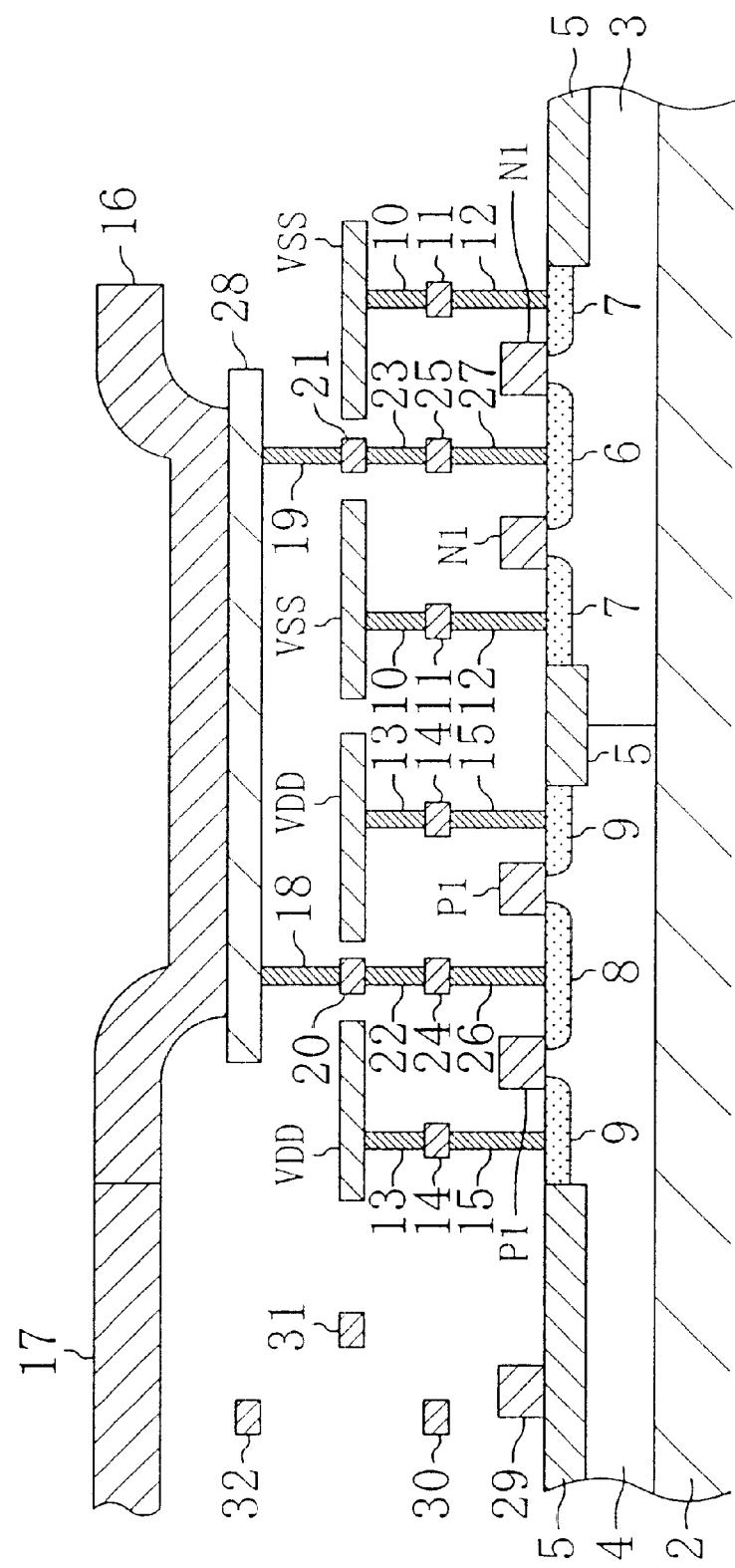
FIG. 6 is a cross-sectional view illustrating a semiconductor device according to the third embodiment of the present invention.
Figure 7:
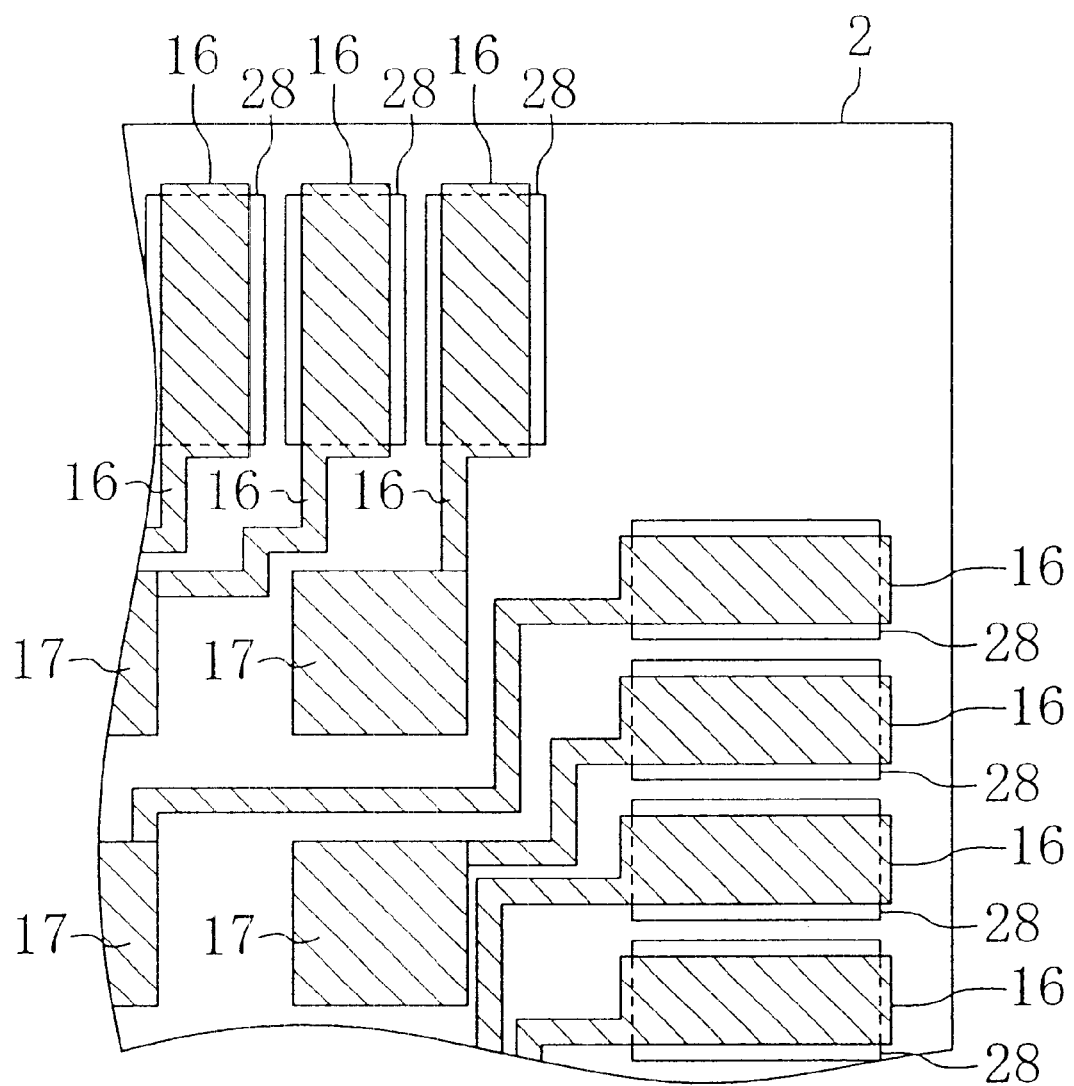
FIG. 7 is a plan view illustrating an arrangement of a plurality of semiconductor devices of the third embodiment.
Figure 8:
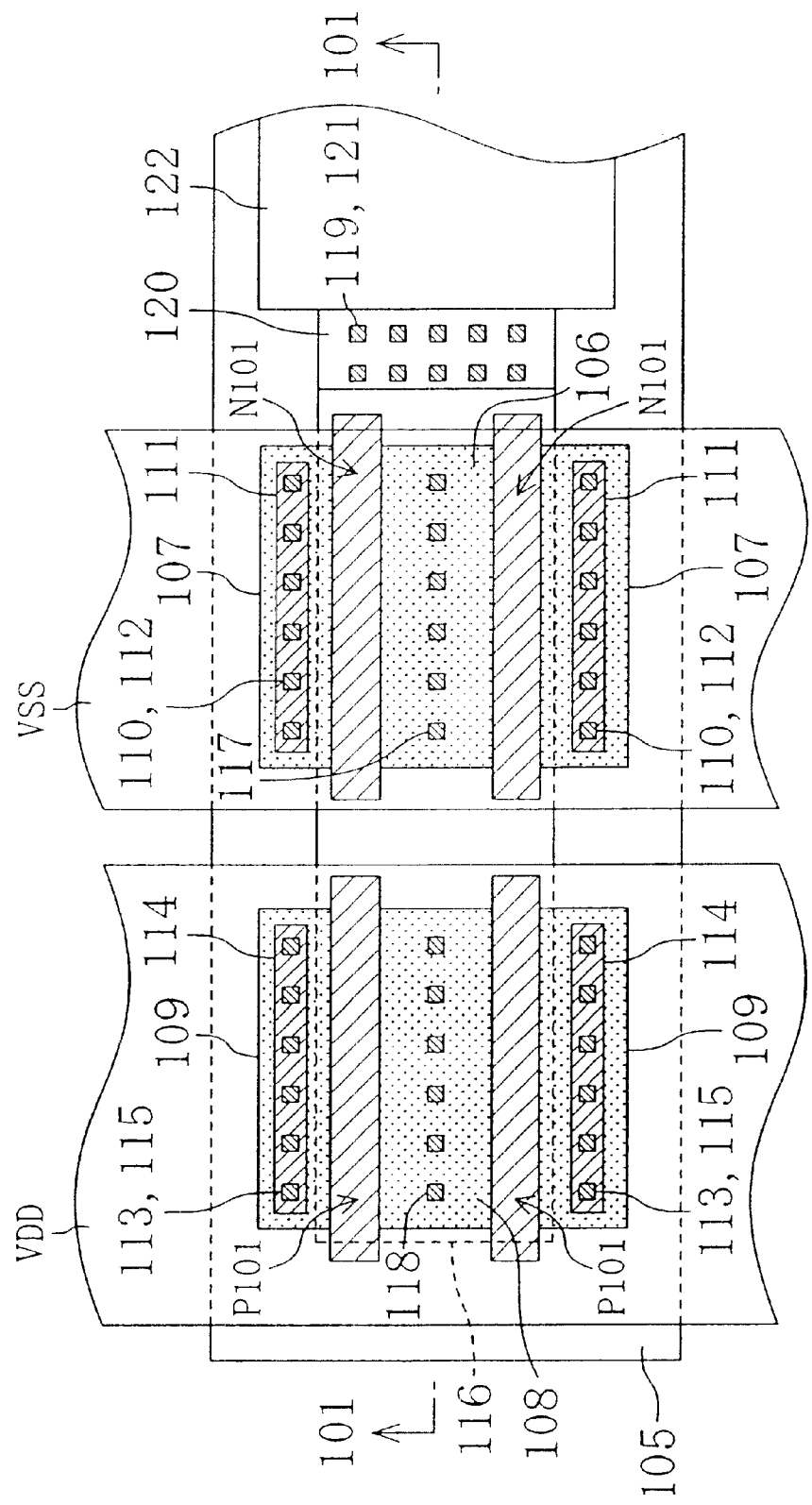
FIG. 8 is a plan view illustrating a wiring structure of a conventional semiconductor device.

FIG. 6 and FIG. 7 illustrate a specific structure of the semiconductor device of the present embodiment. The present embodiment is different from the first embodiment in that the metal line connected to the pad 17 is provided as a two-layer line, and an area pad structure is employed in which the pad 17 is provided in the central region of the chip rather than in the peripheral region of the chip as illustrated in FIG. 7.

Specifically, referring to FIG. 6 and FIG. 7, the metal line 16 in the fourth wiring layer (the uppermost wiring layer) is extended into the central region of the chip to form the area pad 17. Another metal line 28 is provided in the third wiring layer under the metal line 16, and is connected to the metal line 16. Each area pad 17 is provided above internal lines 29 to 32 as illustrated in FIG. 6. The metal line 28 in the third wiring layer functions to provide a connection between the metal line 16 in the uppermost wiring layer and the drain of each of the output transistors P1 and N1 via the via holes 18 and 19, etc.

Figure 12:
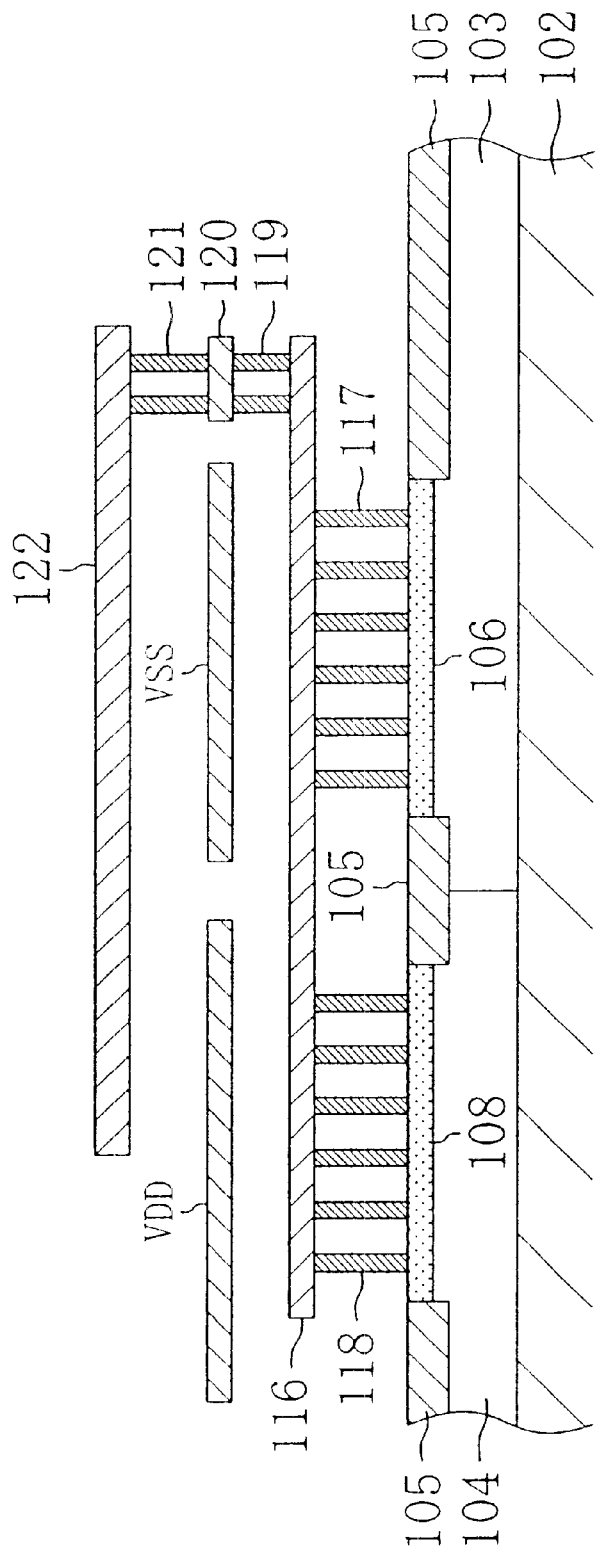
FIG. 12 is a cross-sectional view illustrating a wiring structure of another conventional semiconductor device having a POE structure.

Thus, the present invention can be used with an area pad structure where the area pad 17 as illustrated in FIG. 7 is provided, in which case the two metal lines 28 and 16 can be laid on one another across a large area above the output transistors P1 and N1 by using a stacked via structure including the via holes 18 and 19, etc. In such a case, the area pad 17 can be provided by extending an end portion of the metal line 16 in the upper layer facing the central region of the chip into the central region of the chip. On the other hand, in either one of the conventional semiconductor devices illustrated in FIG. 9 and FIG. 12, the two power supply lines VDD and VSS are located above the metal line 116 in the first wiring layer. Therefore, in order to provide an area pad, it is necessary to provide a connection path extending from an end of the metal line 116 that is close the periphery of the chip to the third wiring layer via the via hole 119, etc., and then further extend the connection path from the peripheral region of the chip into the central region of the chip. This increases the length of the metal line. Thus, in the semiconductor device of the third embodiment, it is not necessary to provide a line connecting region such as the via hole 119 of the conventional semiconductor device illustrated in FIG. 9, and the length of the metal line can be reduced as compared to that of the conventional semiconductor device, thereby reducing the layout area.

While it has been assumed in the above description that the number of wiring layers is three or four, the number of wiring layers is not limited to any particular number in the present invention, as long as the metal line connected to the pad is provided in a wiring layer that is higher in position than the wiring layer in which the power supply lines connected to the output transistors are provided. While the two power supply lines VDD and VSS connected to the output transistors are provided in the same wiring layer in the above description, they may of course be provided in different wiring layers.

What is claimed is:

1. A semiconductor device, comprising:

a plurality of wiring layers;

an output transistor provided on a substrate;

a power supply line provided in a predetermined one of the wiring layers for supplying power to the output transistor;

a pad for connecting an output of the output transistor to an external unit; and a metal line for connecting the output transistor to the pad, said metal line extending over said output transistor, wherein:

the metal line is provided in a first one of said plurality of wiring layers that is higher in position than said predetermined one of the wiring layers in which the power supply line is provided; and a wiring area ratio of a second one of said plurality of wiring layers, which is provided under said predetermined one of the wiring layers in which the power supply line is provided, is less that a wiring area ratio of said predetermined one of the wiring layers in which the supplied supply line is provided.

2. The semiconductor device of claim 1, wherein:

the plurality of wiring layers include three or more wiring layers; and the metal line for connecting the output transistor to the pad is provided in an uppermost one of the wiring layers.

3. The semiconductor device of claim 1, wherein:

the output transistor includes a first-conductivity-type transistor and a second-conductivity-type transistor;

the first-conductivity-type transistor includes a first-conductivity-type diffusion region which is connected to the metal line;

the second-conductivity-type transistor includes a second-conductivity-type diffusion region which is connected to the metal line; and the predetermined one of the wiring layers includes a vacant region where the power supply line is not present, the vacant region existing above the first- and second-conductivity-type diffusion regions which are connected to the metal line.

4. The semiconductor device of claim 3, wherein the first- and second-conductivity-type transistors are provided so that a longitudinal direction thereof is parallel to a width direction of the pad.

5. The semiconductor device of claim 4, wherein the power supply line is provided so as to extend in parallel to the longitudinal direction of the first- and second-conductivity-type transistors.

6. The semiconductor device of claim 3, wherein a via hole of a stacked via structure is provided so as to extend from each of the first- and second-conductivity-type diffusion regions to the vacant region in the predetermined one of the wiring layers, the via hole extending between the predetermined one of the wiring layers in which the power supply line is provided and the first- and second-conductivity-type diffusion regions of the first- and second-conductivity-type transistors which are connected to the metal line.

7. The semiconductor device of claim 2, wherein a part of the metal line provided in the uppermost one of the wiring layers is used as the pad.

8. The semiconductor device of claim 7, wherein the pad is located above the output transistor.

9. The semiconductor device of claim 1, wherein the metal line is provided in two or more of the wiring layers that adjoin one another in a vertical direction.

10. The semiconductor device according to claim 4, wherein said power supply line has a longitudinal axis and said first and second conductivity-type transistors have a longitudinal axis, said longitudinal axis of said power supply extends in parallel and in the same direction as said longitudinal axis of said first and second conductivity-type transistors.

11. The semiconductor device according to claim 3, wherein each of said first and second conductivity-type diffusion regions are connected to the metal line via a straight vertical path extending through said vacant region.

12. The semiconductor device according to claim 3, wherein said metal layer extends over each of said first and second conductivity-type diffusion layers.

* * * * *